US007109821B2

(12) United States Patent
Engargiola

(10) Patent No.: US 7,109,821 B2
(45) Date of Patent: Sep. 19, 2006

(54) CONNECTIONS AND FEEDS FOR BROADBAND ANTENNAS

(75) Inventor: Gregory Engargiola, El Cerrito, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/868,677

(22) Filed: Jun. 15, 2004

(65) Prior Publication Data

US 2005/0017907 A1 Jan. 27, 2005

Related U.S. Application Data

(60) Provisional application No. 60/478,888, filed on Jun. 16, 2003.

(51) Int. Cl.
*H03H 7/42* (2006.01)
*H03H 7/38* (2006.01)
*H01Q 11/10* (2006.01)
*H01Q 9/16* (2006.01)

(52) U.S. Cl. ....................... 333/26; 333/34; 343/792.5; 343/821

(58) Field of Classification Search .................. 333/25, 333/26; 343/795, 797, 756, 708, 792.5, 821
See application file for complete search history.

(56) References Cited

U.S. PATENT DOCUMENTS

| | | | | |
|---|---|---|---|---|
| 3,523,260 | A * | 8/1970 | Gunshinan et al. | 333/26 |
| 3,976,959 | A | 8/1976 | Gaspari | 333/26 |
| 4,063,176 | A | 12/1977 | Milligan et al. | 455/32 |
| 4,224,572 | A | 9/1980 | Will | 455/326 |
| 4,287,518 | A * | 9/1981 | Frosch et al. | 343/700 MS |
| 4,725,792 | A | 2/1988 | Lampe, Jr. | 333/26 |
| 4,739,289 | A | 4/1988 | Cripps | 333/26 |
| 4,847,626 | A | 7/1989 | Kahler et al. | 343/700 MS |
| 5,021,799 | A | 6/1991 | Kobus et al. | 343/795 |
| 5,148,130 | A | 9/1992 | Dietrich | 333/25 |
| 5,172,082 | A * | 12/1992 | Livingston et al. | 333/26 |
| 5,191,351 | A | 3/1993 | Hofer et al. | 343/895 |
| 5,280,297 | A * | 1/1994 | Profera, Jr. | 343/754 |
| 5,304,959 | A | 4/1994 | Wisherd et al. | 333/26 |
| 5,325,105 | A | 6/1994 | Cermignani et al. | 343/786 |

(Continued)

OTHER PUBLICATIONS

"Antenna Engineering Handbook" (Third Edition), McGraw Hill, © 1993, 37 pp.
Proceedings of the IEEE, vol. 53, Jun. 1965, pp. 647-648.

*Primary Examiner*—Dean Takaoka
(74) *Attorney, Agent, or Firm*—Michaelson & Associates; Peter L. Michaelson; George Wolken, Jr.

(57) ABSTRACT

The present invention relates to connecting and impedance matching a balanced electrical signal, such as that received by an antenna, with an unbalanced transmission circuit, such as that delivered to an amplifier. A planar circuit board is described that delivers signals having opposite polarization collected by different antenna arms to a location for convenient connection to a twin-lead transmission line. Circuit topologies for the circuit board are described that provide relatively low loss and low cross-coupling. A tapered microstrip balun is also described that includes two conducting microstrips on opposing faces of a dielectric separator. Stepped or tapered microstrips at the balanced input port of the balun provide an impedance transforming section electrically connecting to a mode transducing section, in which one of the microstrips tapers outward to form a substantially wider strip. Appropriate choice of parameters is shown to lead to favorable performance in a compact balun.

7 Claims, 9 Drawing Sheets

U.S. PATENT DOCUMENTS

| | | | | |
|---|---|---|---|---|
| 5,349,365 | A | 9/1994 | Ow et al. | 343/895 |
| 5,678,201 | A | 10/1997 | Thill | 455/89 |
| 5,825,263 | A | 10/1998 | Falt | 333/204 |
| 5,847,682 | A | 12/1998 | Ke | 343/752 |
| 5,872,549 | A | 2/1999 | Huynh et al. | 343/895 |
| 5,892,485 | A * | 4/1999 | Glabe et al. | 343/789 |
| 5,898,411 | A * | 4/1999 | McGaffigan et al. | 343/801 |
| 6,084,485 | A | 7/2000 | Bickford et al. | 333/26 |
| 6,121,936 | A | 9/2000 | Hemming et al. | 343/769 |
| 6,339,405 | B1 * | 1/2002 | Gleener | 343/795 |
| 6,498,540 | B1 | 12/2002 | Deckman | 333/26 |
| 2004/0012534 | A1 | 1/2004 | Dai et al. | |

* cited by examiner (a)

(b)

CONNECTIONS AND FEEDS FOR BROADBAND ANTENNAS

CROSS REFERENCE TO RELATED APPLICATION

Pursuant to 35 U.S.C § 119, this application claims priority from provisional patent application Ser. No. 60/478,888, filed Jun. 16, 2003, the entire contents of which is incorporated herein by reference for all purposes.

BACKGROUND OF THE INVENTION

1. Field of Invention

This invention relates generally to the field of interconnecting broadband antennas with detection or transmission electronics and, more particularly, to baluns and other devices for effecting such interconnections.

Financial support from the SETI Institute, made possible by the Paul G. Allen Foundation, is gratefully acknowledged.

2. Description of the Prior Art

Many antennas generate balanced signals across their input terminals requiring the inclusion of a balun between the terminals and an amplifier, detector or other electronics that typically require unbalanced input. A "balun" is basically an impedance transformer designed to couple a balanced transmission circuit and an unbalanced transmission circuit. The impedance transformation can be performed by a variety of well-known techniques, but the conversion between a balanced mode and an unbalanced mode typically requires special techniques. See, for example, "Antenna Engineering Handbook, Third Edition," Richard C. Johnson (Ed.) (McGraw-Hill Publishing, 1993), especially Chapter 43, "Impedance Matching and Broadbanding," by David F. Bowman and Section 43-6, pp. 43-23 to 43-27 and references cited. The contents of Chapter 43 is incorporated herein by reference.

Our discussion and description will chiefly focus on the detection of weak signals as typically required in the field of radio astronomy. However, this is by way of illustration and not limitation as other applications of the present devices and techniques, including applications for the transmission of signals through an antenna, will be apparent to those having ordinary skills in the art.

In addition to connecting and impedance matching the balanced signals received at the input terminals of an antenna with unbalanced detection electronics, it is also important that the signals be delivered to the amplifiers with as little loss as possible. Thus, it is advantageous to have the amplifiers (and cryogenic devices in some applications) located as close to the antenna terminals as feasible, and to locate these devices so as to cause as little disruption as feasible with the performance of the antenna. Space is often quite limited in the regions of antennas near the input terminals where electronics can be located, so a compact design for baluns and interconnects is advantageous. Therefore, a need exists in the art for balun and interconnection devices and techniques that permit the connection of balanced signals received at the input terminals of an antenna with unbalanced electronic devices located in close proximity to the input terminals, while avoiding substantial signal loss and avoiding substantial interference with the performance of the antenna.

SUMMARY OF THE INVENTION

Accordingly and advantageously the present invention includes devices, systems and techniques for connecting balanced input signals, such as those received by an antenna, with an unbalanced transmission circuit, such as that advantageously employed to deliver signals to an amplifier.

Accordingly and advantageously the present invention includes devices, systems and techniques for connecting balanced input signals, such as those received by an antenna, with an unbalanced transmission circuit, such as that advantageously employed to deliver signal to an amplifier.

Various embodiments of a planar circuit board are described containing electrically conducting traces or probes delivering the signal from the terminals of the antenna to holes or RF vias for connection to a transmission line. An object of the present invention is to provide a planar circuit board whose probes have substantially equal electrical length and impedance. Other objectives include providing a planar circuit board whose probes have low losses and low cross-coupling between polarization modes.

Several embodiments of a tapered microstrip balun are described in which electrically conducting microstrips lie on opposing surfaces of a reasonably thin dielectric separator. An impedance transforming section of the balun has a configuration so as to connect with contacts in the planar circuit board or other transmission line leading from the terminals of the antenna. The balun's impedance transforming section includes stepped or tapered microstrips electrically connecting to a mode transducing section of the balun. The mode transducing section includes a tapered portion of one microstrip, forming thereby a substantially wider microstrip at the unbalanced port of the balun. Optionally, a resistive card vane may be located substantially perpendicular to the balun's dielectric separator and substantially parallel to the midline of the microstrip conductors for suppressing unwanted modes. Important objects of the invention include providing a compact balun, advantageously constructed for the delivery of balanced antenna signals to amplifiers or other detection electronics located in close proximity to the antenna terminals.

When two or more baluns are mounted in the interior of an antenna, one or more conducting septa may optionally be located so as to separate the baluns and reduce or avoid capacitive coupling between baluns.

These and other advantages are achieved in accordance with the present invention as described in detail below.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The techniques of the present invention can readily be understood by considering the following detailed description in conjunction with the accompanying drawings, in which.

DETAILED DESCRIPTION OF THE INVENTION

Figure 1:
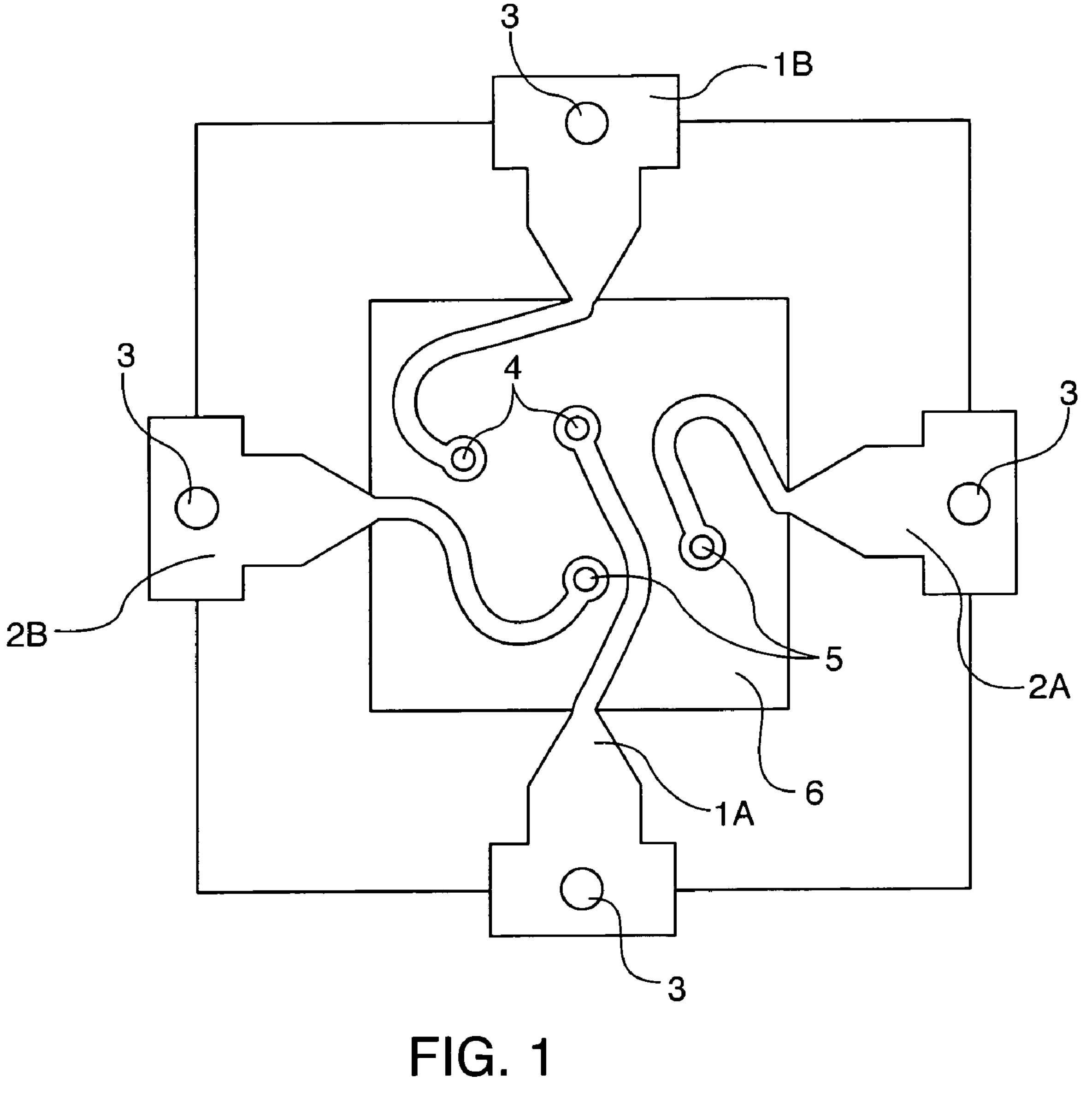
FIG. 1 depicts a schematic top view of a connection board.

After considering the following description, those skilled in the art will clearly realize that the teachings of the invention can be readily utilized in connecting and/or impedance matching a balanced transmission circuit with an unbalanced transmission circuit as typically arising in connections to the feed of a broadband antenna.

The bandwidth of a microwave reflector telescope is typically limited by the size and figure accuracy of the mirror elements and by the feed which couples focused radiation to the receiver. A single or hybrid-mode feedhorn can effectively illuminate a telescope aperture with low ohmic loss. However, its gain typically varies quadratically with frequency, limiting its effective bandwidth to typically less than an octave.

A log-periodic (LP) antenna can be designed to illuminate a telescope aperture over multi-octave bandwidths, but may have greater spillover and ohmic loss than a well-designed feedhorn. Moreover, in contrast to a horn, an LP antenna is typically a large open structure requiring a long twin-lead or coaxial cable to carry signals away from the near field region before amplification. Loss in such cables can be greater than 1 dB (decibel), contributing more than 60 deg. K to the receiver noise temperature.

Various embodiments of LP antennas, including an interior shield in some embodiments, have been described in U.S. Pat. No. 6,677,913. The paper entitled "Non-planar log-periodic antenna feed for integration with a cryogenic microwave amplifier", by Gregory Engargiola presented at the "2002 IEEE Antennas and Propagation Society International Symposium and URSI National Radio Science Meeting," Jun. 16–21, 2002, ("Reference A" herein for economy of language) also describes a non-planar log-periodic antenna feed to which cryogenic electronics can conveniently be attached without the need for a long (typically lossy) section of transmission line. The entire contents of both of these references, Reference A and U.S. Pat. No. 6,677,913, is incorporated herein by reference. The interior shield provides a useful location for placing electronic and cryogenic devices in proximity to the antenna input terminals yet, due to the interposition of the shield, not seriously disturbing the operation of the LP antenna.

While the interior shield of LP antennas provides an isolated location for electronics, the volume available in proximity to the feed terminals is typically quite limited. Therefore, it is advantageous for the interconnects, baluns and other devices pursuant to various embodiments of the present invention (hereafter "interconnects") to have relatively small size (or be capable of fabrication in small size). While advantageous in connection with LP antennas, this is not a limitation on the applicability of such interconnects as miniaturization will be advantageous in other applications as well.

To be concrete in our discussion, we will focus on interconnects suited for use with non-planar log-periodic antennas, particularly antennas as described in Reference A and U.S. Pat. No. 6,677,913. However, this is by way of illustration and not limitation since the present interconnection devices and techniques can be employed in other forms of broadband antennas, including but not limited to planar log-periodic antennas. In addition, the devices and techniques described herein offer novel and advantageous features that can be advantageously employed in devices other than antennas.

A high frequency planar or non-planar log-periodic or broadband antenna typically includes a plurality of arms with closely spaced balanced electrical terminals. It is advantageous to connect these terminals to one or more amplifiers (or to deliver electrical signals to these terminals by an interconnecting microwave circuit) such that:

1) There is little or no interference with the radiation fields generated or received by the antenna.

2) Signals associated with orthogonal polarization channels are separated or uncoupled.

3) The signal, whether received or transmitted, is minimally attenuated. That is, the insertion losses in transmission or the reception losses in reception, are as small as reasonably possible.

4) The interconnecting circuit connecting the antenna to an amplifier, detector or transmitter matches the impedance of the antenna terminals to the input impedance of the detector or amplifier (or to the output impedance of the transmitter).

5) The interconnection circuit may optionally include the capability for transducing a balanced signal (+V, −V) as typically received at, or applied to, antenna terminals and generally requiring a two-wire transmission line) to an unbalanced signal (as typically required as input to many amplifiers through an unbalanced transmission line such as a coaxial cable).

We describe herein a connection system and devices that generally meet these conditions and give a specific example of its application to a four-arm non-planar log-periodic antenna. This antenna has a generally pyramidal shape with each pair of opposing arms receiving an orthogonal polarization (Reference A).

Good performance of an LP antenna at high frequencies calls for truncation of the antenna at reasonably small dimensions, leading to a relatively small area for connection circuits. Such connections are advantageously low loss and do not introduce cross-coupling between the orthogonal polarization modes.

FIG. 1 depicts a planar circuit (or planar circuit board or connection board), pursuant to some embodiments of the present invention. The planar circuit is relatively small in size and configured to be located at the narrow apex of a non-planar LP antenna or at the center of a planar LP antenna. The dimensions in FIG. 1 are in inches and are included for purposes of illustration of a particular embodiment of the planar circuit advantageously used in conjunction with a four-arm LP antenna, truncated so as to give good performance up to about 10 GHz (GHz=GigaHertz=$10^9$ Hertz). Other dimensions can also be used in connection with other types of LP, planar or broadband antenna as determined by routine testing or computer simulation with appropriate software, such as IE3D Version 9.0 (Zeland Software, Inc., Fremont, Calif.).

Figure 2:
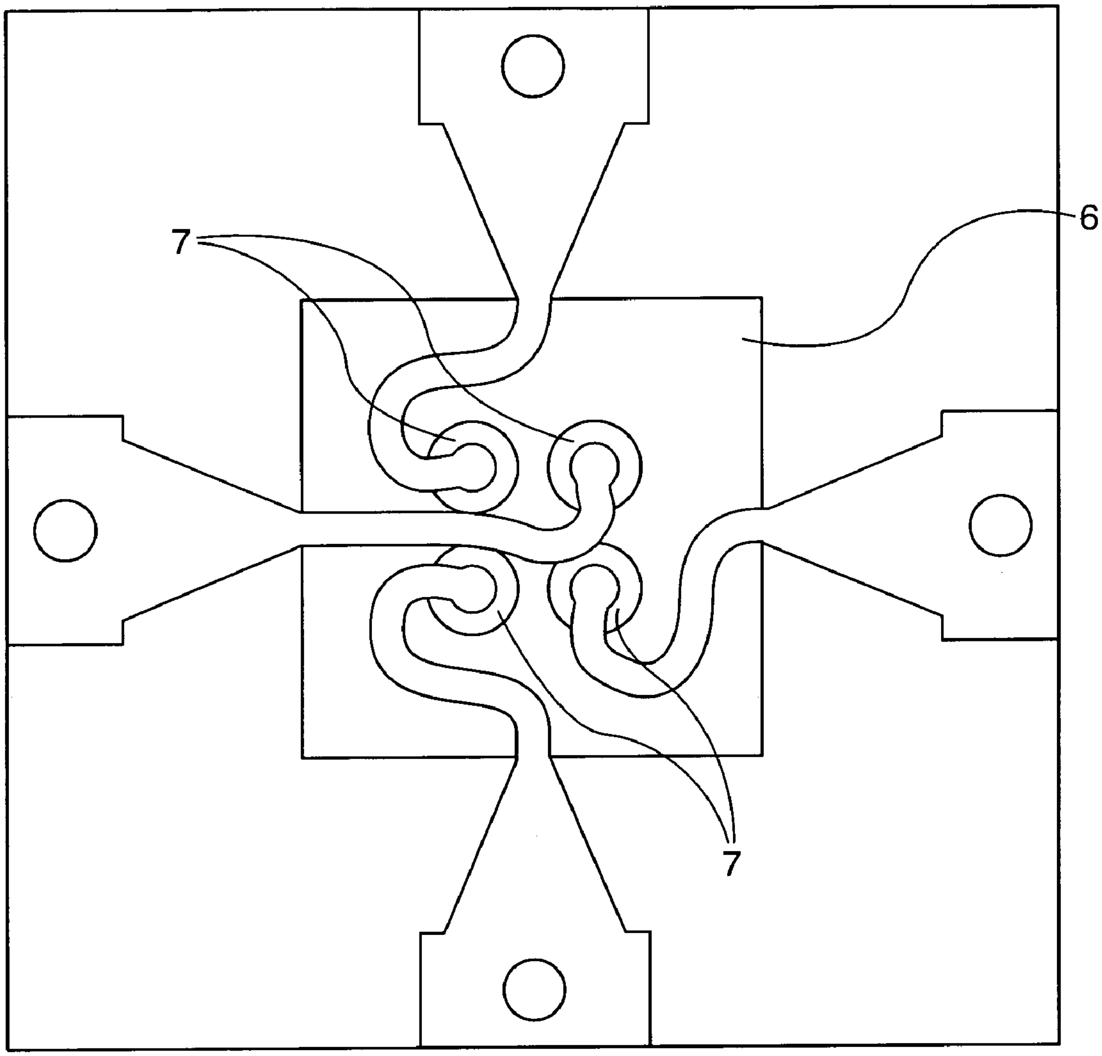
FIG. 2 depicts a schematic top view of a connection board having a different probe geometry from that depicted in FIG. 1.

Another realization of this planar circuit is depicted in FIG. 2. In light of the descriptions and depictions herein, other configurations and dimensions can readily be determined by those with ordinary skills in the art and compatible with planar or non-planar LP antennas as well as other types of antennas.

The planar circuit of FIG. 1 includes four traces or probes, 1*a*, 1*b*, 2*a*, 2*b*. These probes make electrical contact with the four arms of the LP antenna through the regions including and/or surrounding attachment holes 3. The probes are advantageously constructed to have substantially equal length and width (that is, substantially equal electrical length and impedance) as depicted in FIG. 1.

The probes typically provide low impedance links between the antenna arms and the electronics or transmission lines situated beneath the planar circuit of FIG. 1 (that is, on the side of the connection board opposite the probes). The unbalanced impedance of each of the probes is advantageously chosen to be about half the balanced impedance of either polarization channel, consisting of an opposing pairs of antenna arms. For example, if opposite antenna arms have a balanced impedance of 240 ohms, each probe line on the planar circuit is advantageously chosen to have an unbalanced impedance of approximately 120 ohms.

Figure 3:
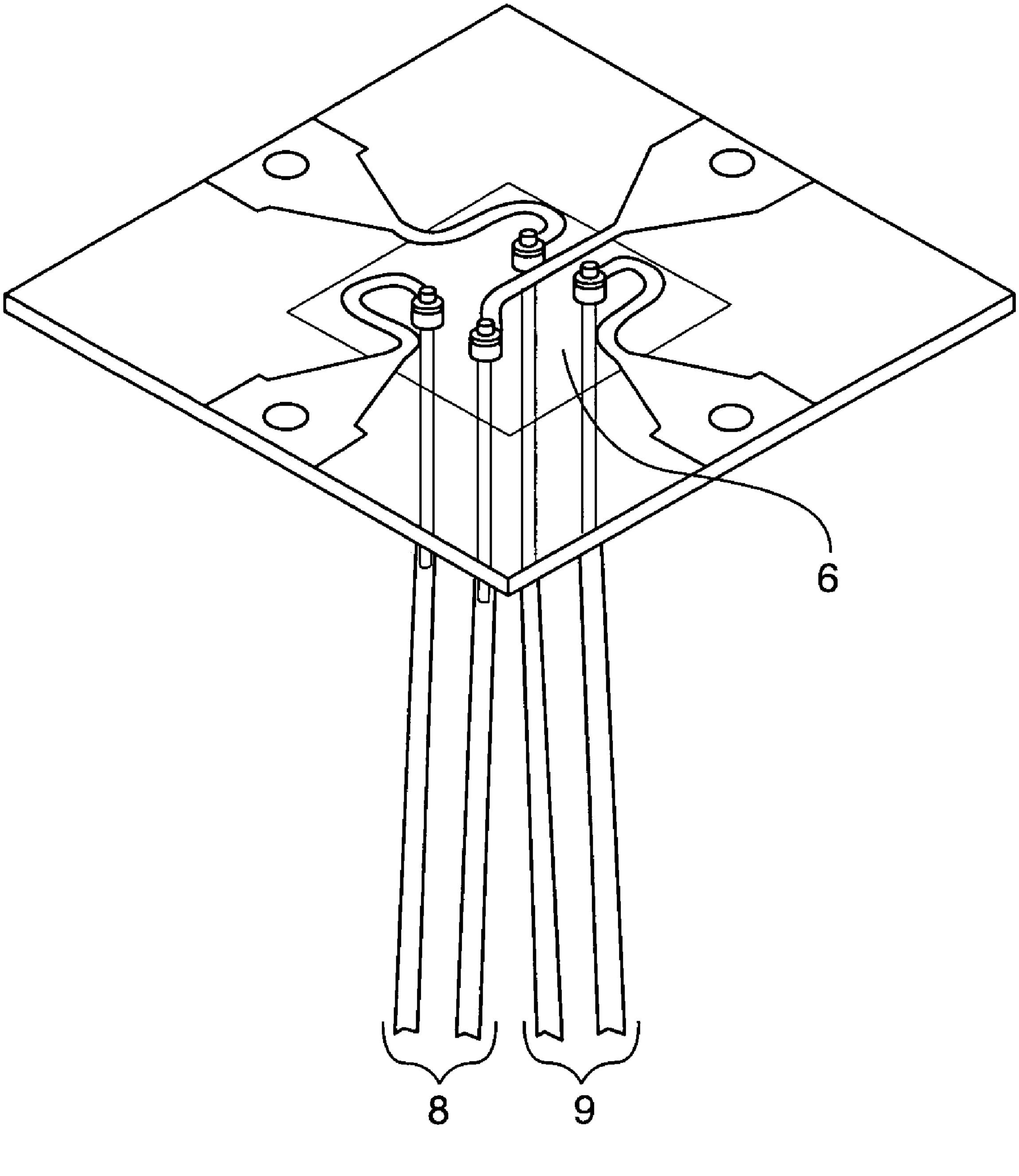
FIG. 3 depicts in perspective view two-lead transmission lines connected to the probes of FIG. 2.

The planar circuit of FIG. 1 also typically includes a ground plane 6 located on the side of the planar circuit opposite the probes. The planar circuit also contains holes 7 through the planar circuit and ground plane (FIG. 3) and connections to transmission lines 8 and 9 (FIG. 3). For connection of the balanced signals of the antenna with the (typically unbalanced) signals required by amplifiers, it is advantageous in some embodiments of the present invention to have a balun located beneath the planar circuit and connected to the antenna by means of lines 8 and 9. Some examples of baluns and balun connections are described elsewhere herein.

The inclusion of a ground plane 6 on the planar circuit board can be employed to substantially reduce signal loss. For example, if inductive wires were used in place of the probes (microstrip transmission lines or microstrip probes) to link baluns the entire way to the antenna, such transmission lines would typically be radiative and incur high losses. The ground plane 6 is advantageously the same ground as the balun or the amplifier/transmitter/receiver, or the interior shield potential in the case of a non-planar LP antenna having an interior shield (see, for example, Reference A and U.S. Pat. No. 6,677,913).

The probes on the connection board as described and depicted herein have an advantageous topology for pairing signals of opposite phase from the two opposing antenna arms (on opposite sides of the pyramidal structure) for connection to a transmission line that lies on one side of the feed. That is, connections 4 in FIG. 1 for the +E, −E antenna arms lie in proximity on one region of the connection board (upper left in FIG. 1) while +H, −H lie in proximity in the diagonally opposite region of the connection board. This permits separation of the (+E, −E) transmission line from the (+H, −H) transmission line beneath the connection board and, in some embodiments of the present invention, separation of the transmission lines with a physical barrier in the region beneath the connection board.

Another connection geometry is depicted in FIG. 2, sharing the same general advantages as that depicted in FIG. 1, such as substantially equal electrical length and impedance, and low cross-polarization coupling. However, while the geometry of FIG. 1 leads to separation of transmission lines into opposite corners of the connection board, that of FIG. 2 separates the transmission lines into opposing faces of the connection board. Both geometries prove advantageous for the coupling of orthogonal polarizations into uncoupled transmission lines and one or the other may offer other advantages in particular cases.

In summary, the planar circuit boards pursuant to some embodiments of the present invention connect, by means of microstrip probes, the balanced signals from opposing antenna arms to two-wire transmission lines parallel to the axis of symmetry of the antenna. Crossover wires are avoided since crossover wires can cause deleterious leakage or coupling between the different polarization channels. Rather, a single wire carrying the signal is threaded from each antenna arm to RF vias or holes, 7, in the planar circuit board for connection to transmission lines beneath.

The LP antennas described herein, as well as many other types of antennas, generate balanced signals across their terminal pairs, requiring the inclusion of a balun between these balanced terminals and an amplifier that typically requires unbalanced input. For good sensitivity, the amplifiers should be as near to the terminals as feasible. A tapered microstrip balun has been developed providing favorable geometry and RF (radio frequency) performance for connecting an amplifier with the balanced antenna terminals and suitable for use with the non-planar LP antennas described herein as well as other antennas and devices. However, the use of the present balun with the particular non-planar LP antenna described herein is for purposes of illustration and not limitation since it is readily apparent to those with ordinary skills in the art that the present balun can be employed in other connection devices and methods, not necessarily limited to antenna technology. To be concrete in our discussion, however, we will describe the particular example of connecting to a non-planar LP antenna.

Simply stated, a balun is a reciprocal transducer, converting an odd signal mode at the antenna terminals to the sum of an odd and even mode at the terminals of an unbalanced transmission line structure. Spatial constraints in a narrow pyramidal shield (as in the present LP antenna), and the need for wide bandwidth indicate that a tapered microstrip balun would be advantageous.

Figure 4:
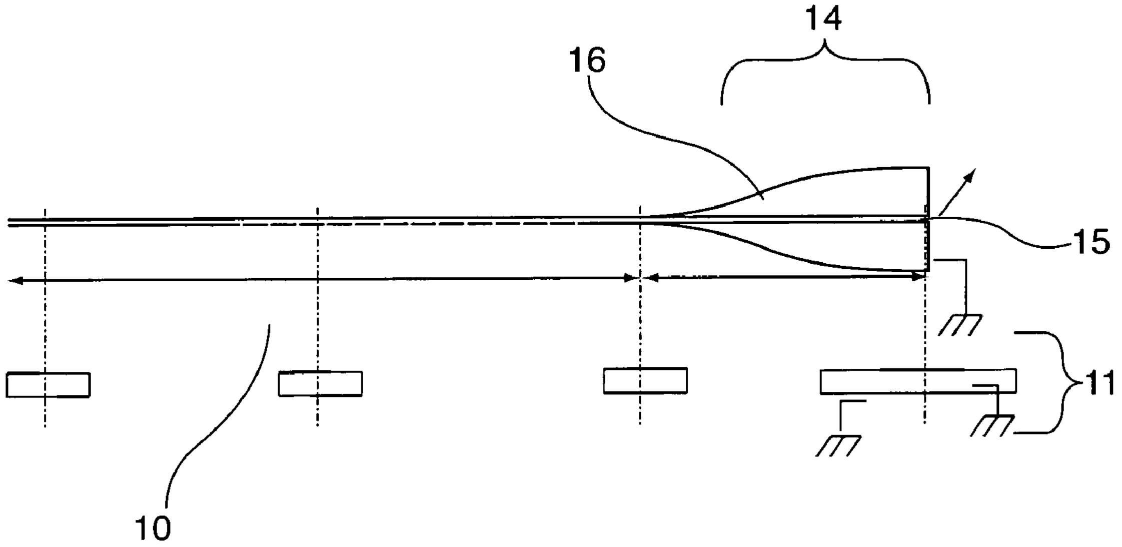
FIG. 4 depicts in schematic top view a typical tapered microstrip balun pursuant to some embodiments of the present invention.

An example of a tapered microstrip balun pursuant to some embodiments of the present invention is depicted in FIG. 4. The numerical values given in FIG. 4 refer to the particular balun design found to be convenient for connecting 240 ohm balanced twin-lead input with 50 ohm unbalanced output. Following the principles described herein, other balun dimensions and/or balun designs will be apparent to those having ordinary skills in the art. See, for example, Reference B, "Tapered microstrip balun for integrating a low noise amplifier with a nonplanar log periodic antenna," by Gregory Engargiola, Review of Scientific Instruments, Vol. 74, No. 12 pp. 5197–5200, December 2003. The entire contents of Reference B is incorporated herein by reference.

Baluns pursuant to some embodiments of the present invention include two conducting microstrips on opposite sides of a dielectric separator. A CUFLON dielectric (Polyfon Co., Norwalk, Conn.) 0.015 inches thick was found to be advantageously employed, giving adequate performance and low losses over the frequency range of interest (approximately 1 GHz to approximately 10 GHz). However, other dielectric materials and thicknesses can be employed.

The tapered microstrip baluns include an impedance transformer section and a section transforming the balanced mode to the unbalanced mode (the "mode transducer" or "mode transducer section"). The impedance transformer section of the balun 10 includes two microstrips on opposite sides of the dielectric separator having geometry and structure chosen for impedance matching. For example, the microstrips can include a sequence of steps as depicted by the cross-section, 11, at various positions along the impedance transformer section.

Figure 5:
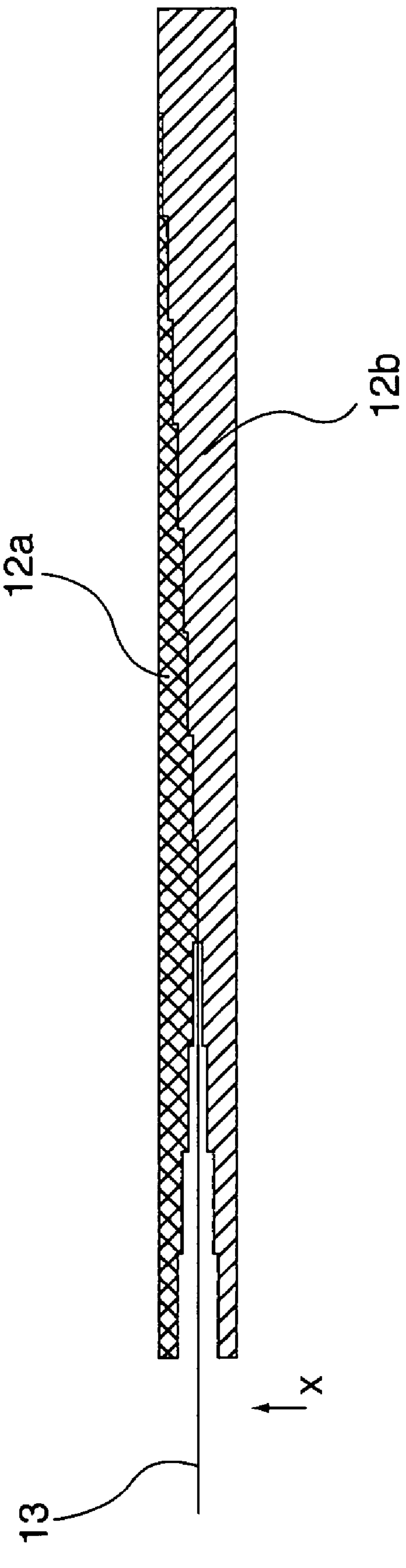
FIG. 5 depicts a schematic top view of one configuration of microstrip conductors at the balanced end of a tapered microstrip balun.

Other embodiments for the impedance transformer section include asymmetrically tapered microstrips as depicted in FIG. 5. FIG. 5 depicts a top view of the balun with the dielectric separator lying in the plane of the figure, microstrip 12*a* below the dielectric separator and 12*b* above, about a midline 13. The asymmetrically tapered microstrips of FIG. 5 cause the outer diameter or overall lateral extent) of the pair of conductors in the x-direction to remain substantially constant, as depicted in FIG. 5. Such a configuration of conductors is expected to be particularly advantageous when it is desirable to keep the lateral extent of the two microstrips across the dielectric separator rather small, while retaining a lateral separation of the microstrips at the balanced end of the balun sufficient for connection to input leads, such as those depicted in FIGS. 1, 2, and 3. In all cases, however, it is advantageous for there to be a lateral separation of the microstrips along the balun. That is, the midline of a microstrip on one side of the dielectric separator does not lie directly superimposed above (or below) the midline for the microstrip conductor on the opposite side of the dielectric separator.

Although the impedance transformer sections depicted in FIGS. 4 and 5 are found to be useful in connecting with some broadband antennas, these and other embodiments can be used advantageously for other connections and applications as determined by routine experimentation and/or computer simulation of balun performance. In particular, in addition to impedance matching, it is found that the particular structure of the balun's impedance transformer section affects the high-frequency performance of the balun and is advantageously designed with a view towards obtaining the desired high-frequency performance.

The impedance transformer section of the balun 10 joins onto the mode transducer 14. The mode transducer accepts the balanced input from the impedance transformer section 10 and produces unbalanced output for delivery to transmission lines, an amplifier, or other electronics. The mode transducer includes one microstrip passing through region 14 with substantially constant width, while the opposing microstrip tapers to a substantially larger lateral dimension 16. The length and structure of the mode transducer, particularly the rapidity of the taper, affect the low frequency performance of the balun. It is found that a quasi-exponential taper is advantageously employed in some embodiments of the present invention.

At the unbalanced end of the balun (the unbalanced port) the mode transducer section of the balun is effectively a microstrip line where the bottom (tapered) conductor is advantageously a ground plane. For use with an LP antenna with a grounded interior shield, it is convenient to make electrical contact between the tapered conductor and the grounded interior shield.

Figure 6:
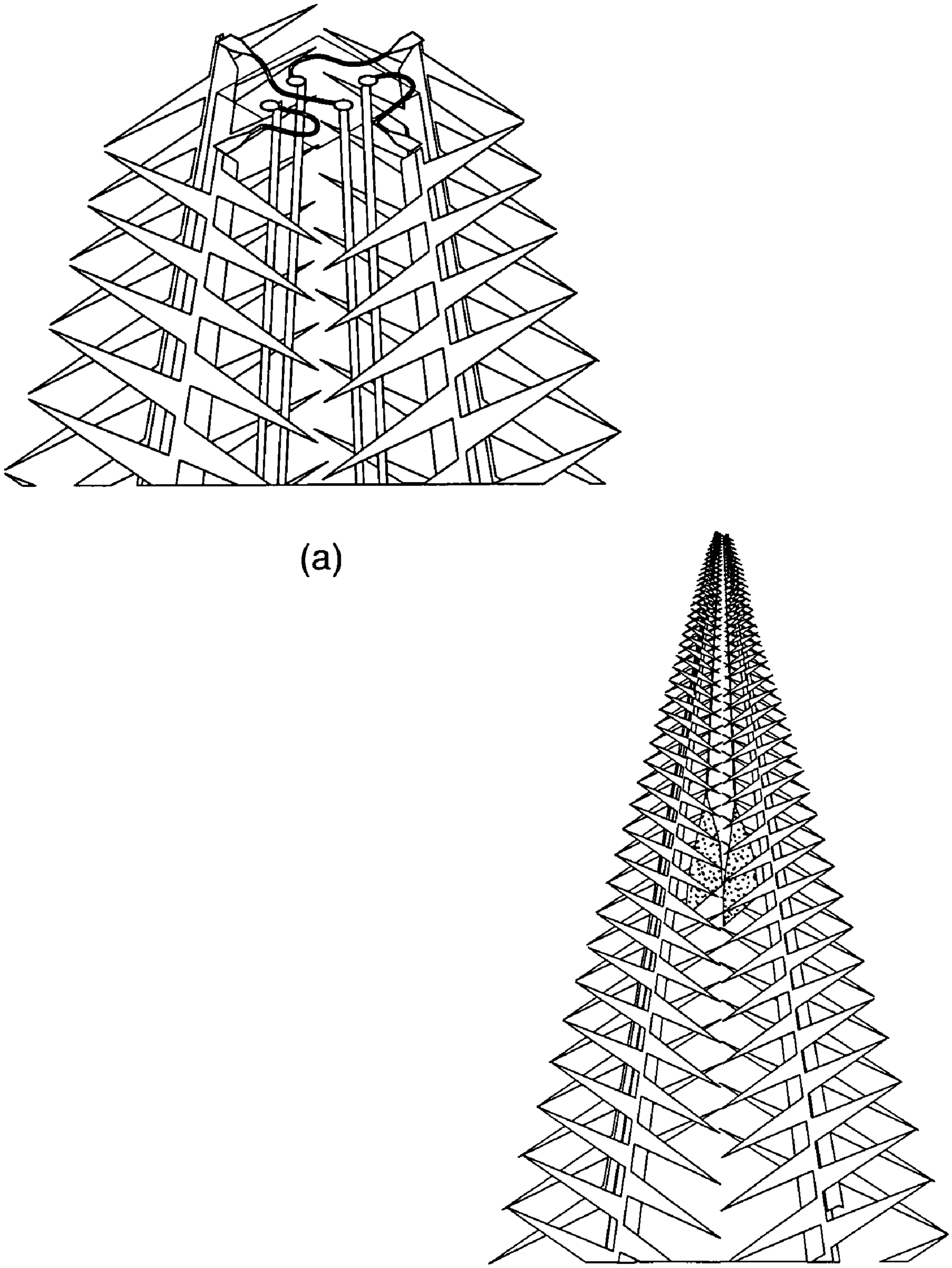
FIG. 6 depicts in perspective view: (a) the balanced ends of two baluns connecting with opposing arms of a non-planar log-periodic antenna through a connection board, and (b) a wider field of view depicting the typical location and orientation of tapered microstrip baluns within the interior shield of a four-arm non-planar log-periodic antenna.

FIG. 6*a* provides a perspective view of how baluns of the type depicted in FIG. 4 can typically be connected to the pairs of opposing antenna arms through the connection board of FIG. 1 or 2. FIG. 6*b* depicts the upper portion of a full size feed in a wider field of view, omitting for clarity the electronics to be connected to the wide, unbalanced ports of the baluns. The interior shield is depicted as translucent to render the baluns and connections visible. The performance of the antenna/baluns can be affected by the specific position and orientation of the baluns within the antenna and within the interior shield. Balun position and/or orientation can be determined for specific cases by routine experimentation and/or computer simulation of antenna/balun performance (with or without the presence of resistive card vane and/or separating septum).

Figure 7:
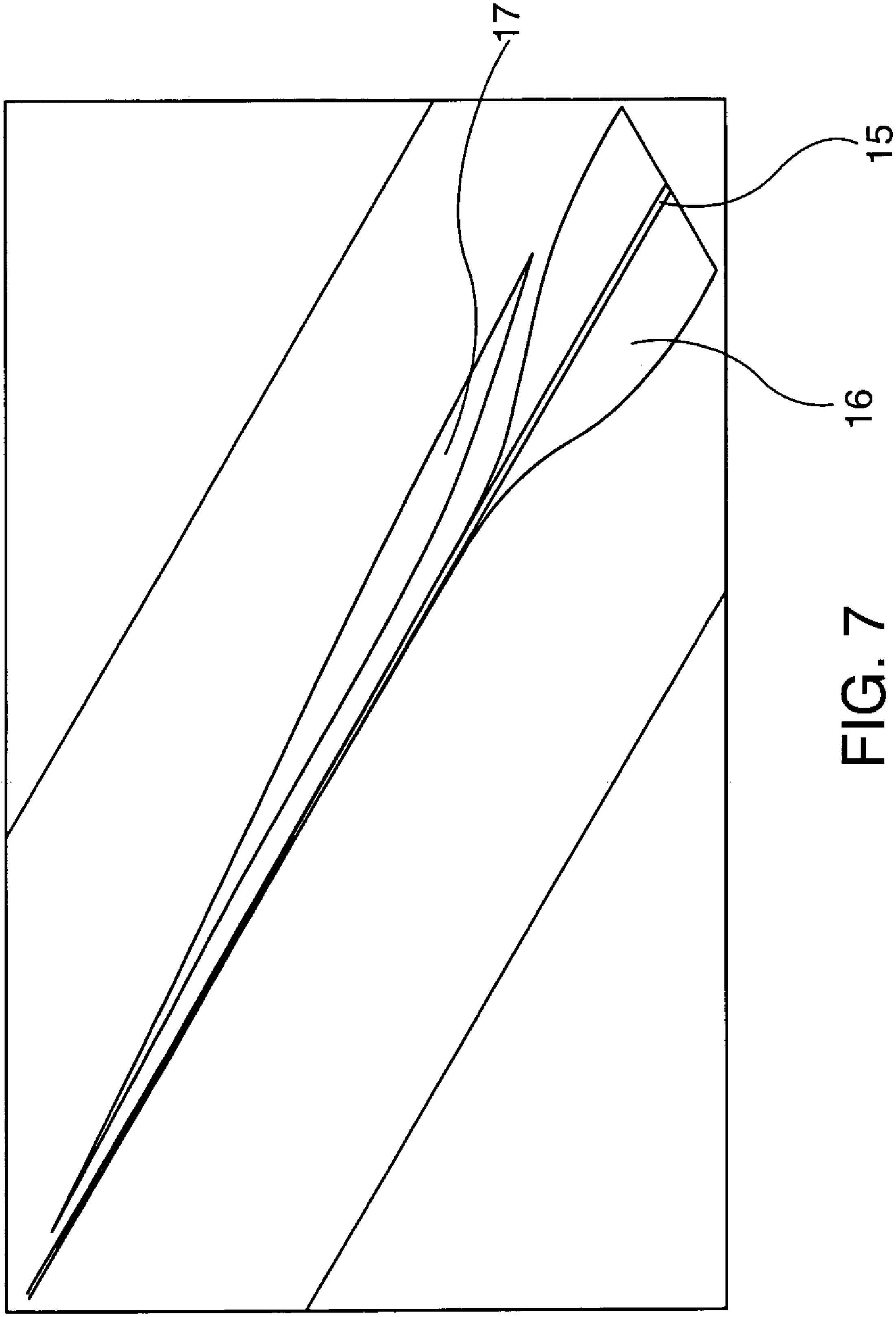
FIG. 7 depicts in perspective view a tapered microstrip balun including a resistive card vane.

It is advantageous in some embodiments of the present invention to locate a resistive card vane perpendicular to the plane of the balun along the midline (but not in electrical contact therewith) depicted as 17 in FIG. 7. When used in conjunction with an LP antenna having an interior shield, it is convenient to attach vane 17 to the inside surface of the shield, or to otherwise make electrical contact between the card vane and the grounded shield. The use of such a card vane can be useful for attenuating unwanted modes on an exposed balun. However, care should be taken not to attenuate the odd mode, particularly in locations where the fringe fields between balanced leads are significant. For this reason, it is typically advantageous for the vane to have its maximum extent at the location of the balun "neck" (transducer input, start of the taper) where balanced fields are broadside coupled and fringe fields typically are at minimum strength.

Figure 8A:
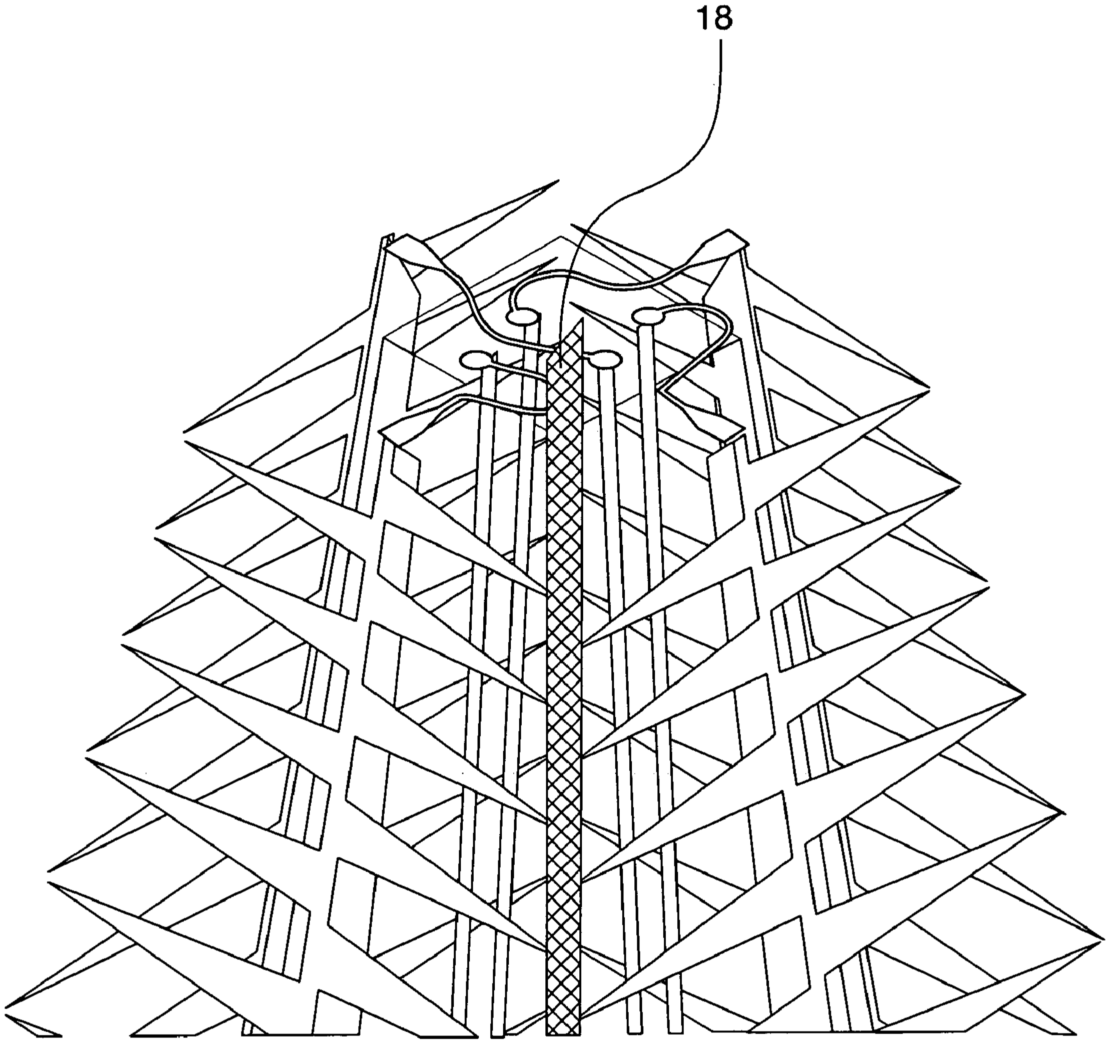
FIGS. 8(*a*) and (*b*) depict in perspective view the balun and antenna connections of FIGS. 6(*a*) and (*b*) respectively with the addition of a septum interposed between the baluns.
Figure 8B:
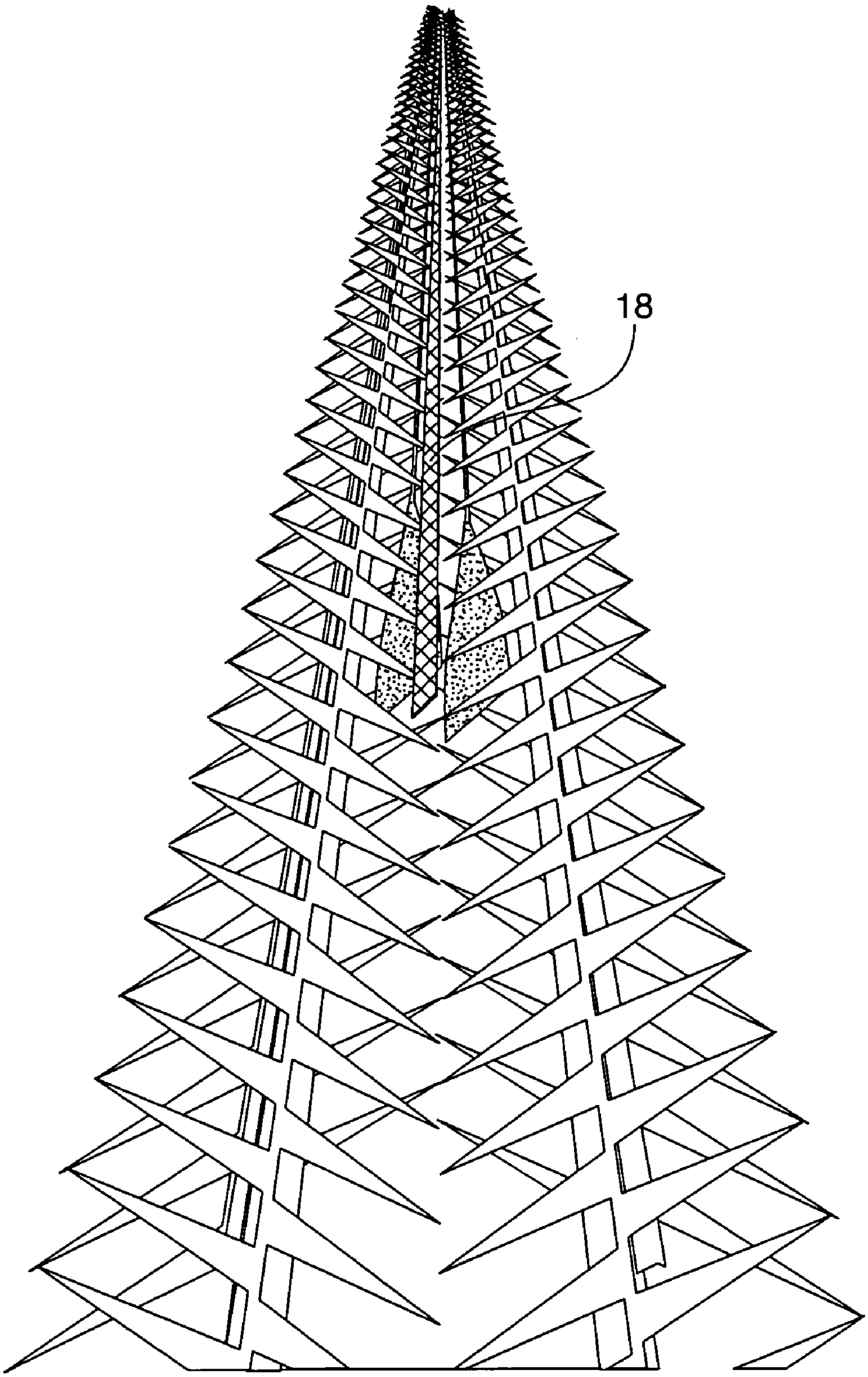

It is advantageous in some embodiments of the present invention for the inner shield volume to be partitioned by a metallic or other conducting septum so reduce or avoid capacitive coupling between the baluns. FIGS. 8*a* and 8*b* depict such a septum 18 separating the baluns. It is typically convenient for septum 18 to be grounded.

Use of a tapered microstrip balun in a narrow cryostat or other restricted volume can often be facilitated by scaling the balun design to use different dielectric separators such as quartz (dielectric constant $\in$ in the range from approximately 3.8 to approximately 4.5), or alumina ($\in$ approximately 9.6). The use of such materials can reduce the length of the balun by more than a factor of 3. By making the tapered microstrip balun as short as possible, one can markedly reduce the noise contribution due to ohmic losses. This can be especially advantageous in designing a high sensitivity log-periodic frontend in which it is desirable to locate cooled GaAs or InP MMIC amplifiers (monolithic microwave integrated circuit amplifiers) as close as possible to the antenna terminals. In the example of a CUFLON dielectric separator ($\in$ approximately 2.1), the impedance matching section of the balun and the mode transducer section were designed and optimized as separate circuits, resulting in a total balun length of around 10 inches. By closely integrating the impedance and mode transducing sections of the balun, it is possible to produce a balun on a quartz substrate (0.020 inches thick) only about 3.7 inches in length, with good performance over the frequency range of approximately 0.5 GHz–11.2 GHz.

Although various embodiments which incorporate the teachings of the present invention have been shown and described in detail herein, those skilled in the art can readily devise many other varied embodiments that still incorporate these teachings.

What is claimed is:

1. A system for electrically connecting to the feed of a broadband antenna comprising:

a) at least one tapered microstrip balun wherein the balanced ends of each of the conducting strips of said balun connect with an arm of said antenna, thereby comprising one balun for each pair of antenna arms; and, b) a connection board located so as to make electrical contact between said arms of said antenna and said balanced ends of said conducting strips of said at least one balun wherein said connection board comprises;

b1) a dielectric layer having thereon a plurality of electrically conducting probes, the first end of each of said probes located so as to connect with a separate, arm of said antenna and wherein each of said probes have substantially equal electrical length and impedance, and wherein none of said probes make electrical contact with another of said probes on said dielectric layer; and, b2) a ground plane; and, b3) holes through said ground plane and said dielectric layer, said holes having location and configuration so as to allow two-wire transmission lines located on the side of said dielectric layer opposite from said probes to make electrical contact with the second end of each of said probes in a pairwise manner.

2. A system as in claim 1 further comprising a grounded electrically conducting shield between said at least one balun and said arms of said antenna wherein said shield has a shape and location so as to maintain self-similarity of the combination of said shield and said antenna.

3. A system as in claim 1 wherein said antenna comprises at least four arms.

4. A system as in claim 2 wherein said antenna comprises at least four arms.

5. A system as in claim 3 wherein said antenna comprises four arms in a substantially pyramidal configuration and two baluns.

6. A system as in claim 4 wherein said antenna comprises four arms in a substantially pyramidal configuration and two baluns.

7. A system as in claim 6 further comprising a grounded electrically conducting septum in the interior of said grounded conducting shield and between said baluns.

* * * * *